(12) United States Patent
Wilkinson

(10) Patent No.: US 10,883,673 B2
(45) Date of Patent: Jan. 5, 2021

(54) DITHERED LEDS TO REDUCE COLOR BANDING IN LENSED LIGHT FIXTURES

(71) Applicant: SIMPLY LEDS, LLC, Garden City, ID (US)

(72) Inventor: Dean A. Wilkinson, Garden City, ID (US)

( * ) Notice: Subject to any disclaimer, the term of this patent is extended or adjusted under 35 U.S.C. 154(b) by 0 days.

(21) Appl. No.: 16/792,074

(22) Filed: Feb. 14, 2020

(65) Prior Publication Data

US 2020/0292139 A1    Sep. 17, 2020

Related U.S. Application Data

(60) Provisional application No. 62/805,831, filed on Feb. 14, 2019.

(51) Int. Cl.
| | |
|---|---|
| *F21K 9/69* | (2016.01) |
| *H01L 25/13* | (2006.01) |
| *F21K 9/90* | (2016.01) |
| *F21S 8/08* | (2006.01) |
| *H01L 33/58* | (2010.01) |
| *F21V 5/00* | (2018.01) |
| *F21W 111/02* | (2006.01) |
| *F21Y 115/10* | (2016.01) |
| *F21Y 105/12* | (2016.01) |

(52) U.S. Cl.
CPC ............... *F21K 9/69* (2016.08); *F21K 9/90* (2013.01); *F21S 8/085* (2013.01); *F21V 5/007* (2013.01); *H01L 25/13* (2013.01); *H01L 33/58* (2013.01); *F21W 2111/02* (2013.01); *F21Y 2105/12* (2016.08); *F21Y 2115/10* (2016.08)

(58) Field of Classification Search
CPC ... F21K 9/69; F21K 9/90; H01L 25/13; H01L 33/58; F21S 8/085; F21V 5/007
See application file for complete search history.

(56) References Cited

U.S. PATENT DOCUMENTS

| | | |
|---|---|---|
| 5,833,355 A | 11/1998 | You |
| 7,354,172 B2 | 4/2008 | Chemel |
| 7,806,558 B2 | 10/2010 | Williamson |
| 7,847,486 B2 | 12/2010 | Ng |
| 8,054,284 B2 * | 11/2011 | Tai ..................... G09G 3/3426 345/102 |
| 8,100,552 B2 | 1/2012 | Spero |
| 8,674,616 B2 | 3/2014 | Holman |
| 9,039,251 B2 | 5/2015 | Howe |

(Continued)

FOREIGN PATENT DOCUMENTS

| WO | WO-2008/066785 A2 | 6/2008 |
|---|---|---|
| WO | WO-2013/158592 A2 | 10/2013 |

(Continued)

*Primary Examiner* — Joseph L Williams
(74) *Attorney, Agent, or Firm* — Scott D. Swanson; Shaver & Swanson, LLP

(57) ABSTRACT

An improved multi-die LED lighting apparatus for use with a lens that facilitates light dispersion while minimizing color banding and maintaining the light distribution intent of the design of the lens. The individual LED die are dithered, both rotationally and spatially relative to neighboring LED dies to minimize color banding of the LED lighting apparatus. The result is an reduction in color banding while seeking to retain the original light dispersion intent of the lens.

13 Claims, 8 Drawing Sheets

(56) References Cited

U.S. PATENT DOCUMENTS

| 9,416,939 B2 | 8/2016 | Roth |
| 9,448,353 B2 | 9/2016 | Holman |
| 2018/0070426 A1 | 3/2018 | Chen |

FOREIGN PATENT DOCUMENTS

| WO | WO-2016/089726 A1 | 6/2016 |
| WO | WO-2016/184844 A1 | 11/2016 |

* cited by examiner

DITHERED LEDS TO REDUCE COLOR BANDING IN LENSED LIGHT FIXTURES

PRIORITY/CROSS-REFERENCE TO RELATED APPLICATIONS

This application claims the benefit of U.S. Provisional Application No. 62/805,831, filed Feb. 14, 2019, the disclosure of which is incorporated by reference.

TECHNICAL FIELD

The presently disclosed and claimed technology generally relates to an improved a light emitting diode (LED) die arrangement and method for creating an improved light emitting diode die arrangement for decreasing color banding in light dispersion applications, and more particularly to improved light dispersion characteristics in decreasing color banding between neighboring LED dies in multi-die LED arrays.

BACKGROUND

Multi die LED lights typically comprise a plurality of LED dies affixed to a printed circuit board. The LED dies and the printed circuit board are often referred to as a Printed Circuit Assembly (PCA). The multi dies are typically affixed to the circuit board in rows and columns with minimal variation. LEDs that are made up of multiple die coated with a phosphor layer have variations in color temperature over the surface of the LED package. The color temperature is bluer where the LED chips are located, and yellower between the chips.

When placed under lenses that are designed to spread the light out over a large area in order to provide uniform illumination, the light toward the edge of the lens pattern exhibits color banding due to the highly magnified image of the LED surface being projected out at those angles. The magnitude and degree of color banding (color temperature variation) is deemed to be aesthetically and functionally unacceptable. Typical lenses that exhibit this problem are known as Type V, Type III, and Type IV streetlight lenses. Light fixtures that exhibit this problem are generally made up of an array of multiple LED packages that sum their banding when they are all placed in the same orientation under the center of individual lenses.

SUMMARY OF THE DISCLOSURE

The purpose of the Summary is to enable the public, and especially the scientists, engineers, and practitioners in the art who are not familiar with patent or legal terms or phraseology, to determine quickly from a cursory inspection, the nature and essence of the technical disclosure of the application. The Summary is neither intended to define the inventive concept(s) of the application, which is measured by the claims, nor is it intended to be limiting as to the scope of the inventive concept(s) in any way.

In order to reduce or eliminate the appearance of clear and sharply defined color temperature bands at the extreme angles of lenses where the LED is highly magnified, the location and rotation of each LED in an array of multiple LEDs can be carried out so as to blend and "smear" the bands. The Applicant has found that this greatly reduces the contrast of the bands, rendering them less visible. This variation in location and rotation is called spatial and rotational dithering. The Applicant has found that this leads to improved lighting characteristics of LED fixture.

Each LED is displaced from the center of each lens in the X and/or Y directions by a distance that is approximately half the distance between individual LED die on each LED package. This causes the color temperature bands from each individual LED to mis-align with those of other LEDs, which causes the bands to average out and be less apparent. Additionally, the LEDs are rotated at various angles to blend the bluish die and yellowish spaces rotationally to further overlap and blend the color temperature bands. The result of dithering the LEDs spatially and rotationally is a greatly reduced appearance of color temperature banding without a significant impact on the angular distribution of light from the lens design. The Applicant's methodology incorporating spatial and rotational dithering leads to increased benefits over alternatives such as the application of a diffusing texture which reduces the banding by scattering light, typically resulting in a significant alteration of the angular distribution of light from the lens as well as a loss of lumen output.

Still other features and advantages of the presently disclosed and claimed inventive concept(s) will become readily apparent to those skilled in this art from the following detailed description describing preferred embodiments of the inventive concept(s), simply by way of illustration of the best mode contemplated by carrying out the inventive concept(s). As will be realized, the inventive concept(s) is capable of modification in various obvious respects all without departing from the inventive concept(s). Accordingly, the drawings and description of the preferred embodiments are to be regarded as illustrative in nature, and not as restrictive in nature.

DETAILED DESCRIPTION OF THE EXEMPLARY EMBODIMENTS

Figure 1A:
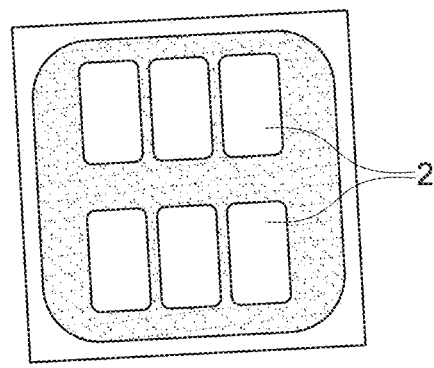
FIG. 1a illustrates a prior art multi-die LED package.

While the presently disclosed inventive concept(s) is susceptible of various modifications and alternative constructions, certain illustrated embodiments thereof have been shown in the drawings and will be described below in detail. It should be understood, however, that there is no intention to limit the inventive concept(s) to the specific form disclosed, but, on the contrary, the presently disclosed and claimed inventive concept(s) is to cover all modifications, alternative constructions, and equivalents falling within the spirit and scope of the inventive concept(s) as defined in the claims.

Figure 1B:
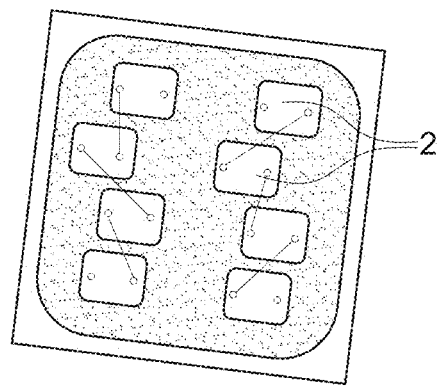
FIG. 1b illustrates a prior art multi-die LED package.
Figure 1C:
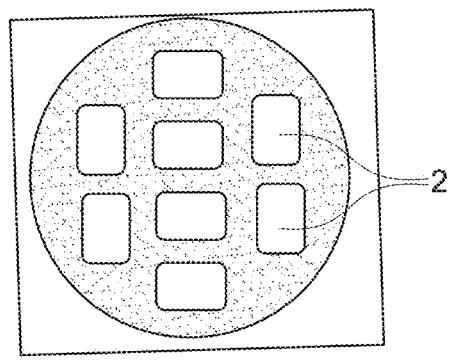
FIG. 1c illustrates a prior art multi-die LED package.
Figure 2:
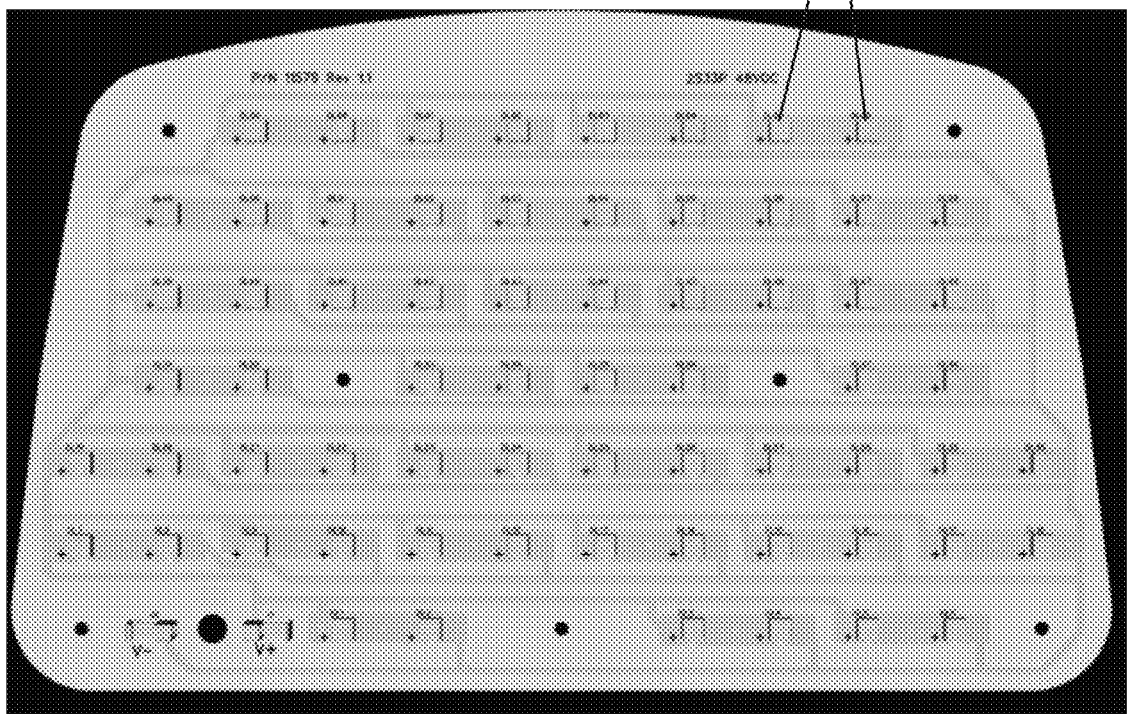
FIG. 2 illustrates a non-dithered LED printed circuit assembly (PCA).
Figure 3:
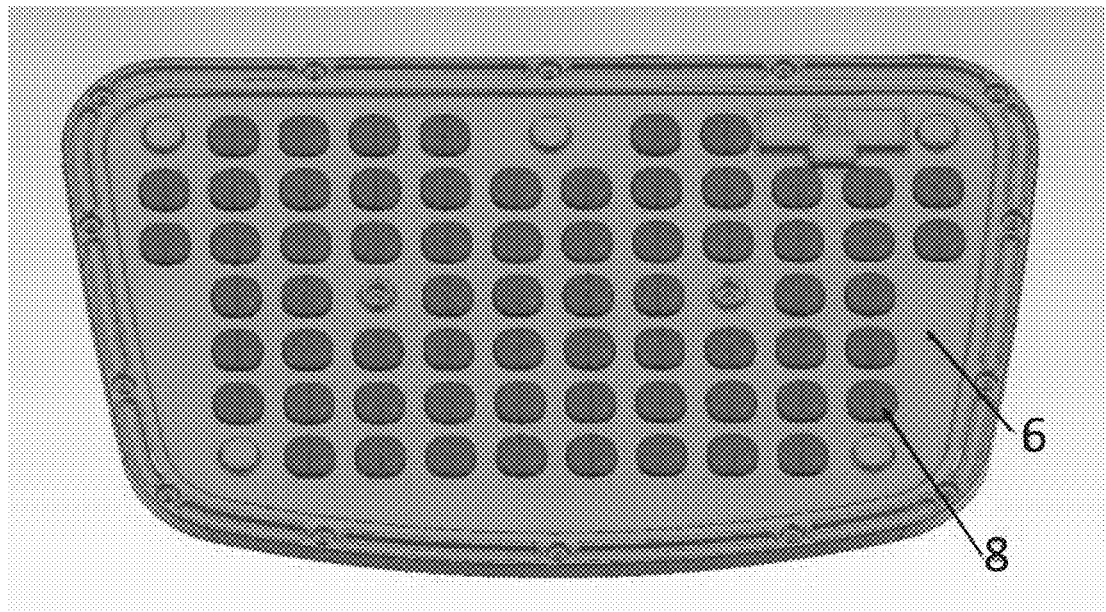
FIG. 3 illustrates a prior art lens array for an LED lamp.
Figure 4:
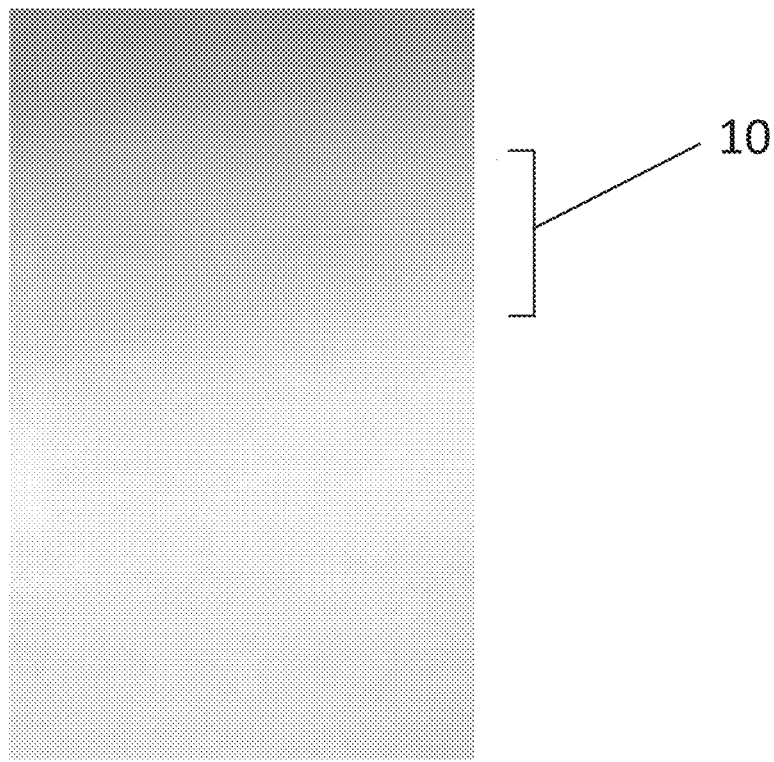
FIG. 4 illustrates an example of color banding from a prior art multi-die LED package.

FIGS. 1a, 1b, and 1c illustrate example configurations of prior art multi-die led packages 2 that are utilized with a lens for lighting purposes for generalized lighting. Example uses of such generalized lighting would be in street or parking lot lights that project light a diffuse manner. These lights are non dithered and provide an aligned appearance either horizontally or vertically in the figures. A further example of a non-dithered LED array on a printed circuit assembly (PCA) of utilizing multiple LED dies is shown in FIG. 2. FIG. 2 shows a PCA having rows of LED dies 4 generally aligned vertically in the figure as well as horizontally. The depicted PCA is a printed circuit board to which LED dies have been affixed. A typical lens array for use with the LED PCA of FIG. 2 is shown in FIG. 3. Typically the lens array utilizes a plurality of individual lenses 8 positioned within the lens cover 6. Each individual lens is configured to disperse light emitted by an individual LED from the LED PCA. The individual lenses function together as a whole to distribute light to illuminate a broad area. However, where color bands overlap from each individual LED die and individual lens the color banding is intensified. FIG. 4 illustrates a sample color banding 10 from a non spatially and non rotationally dithered multi die LED PCA. The yellow band is fairly pronounced on the image, in particular when compared to the color banding image of spatially and rotationally dithered LED PCA of FIG. 6. One prior art solution to minimize color banding is to apply a different texture to the individual lenses of a lens array (or an entire lens array) or to the phosphor layer to reduce color banding by scattering light. However, this texture results in an alternation of the angular distribution of light from the lens as well as a loss of lumen output due to the texture.

Figure 5:
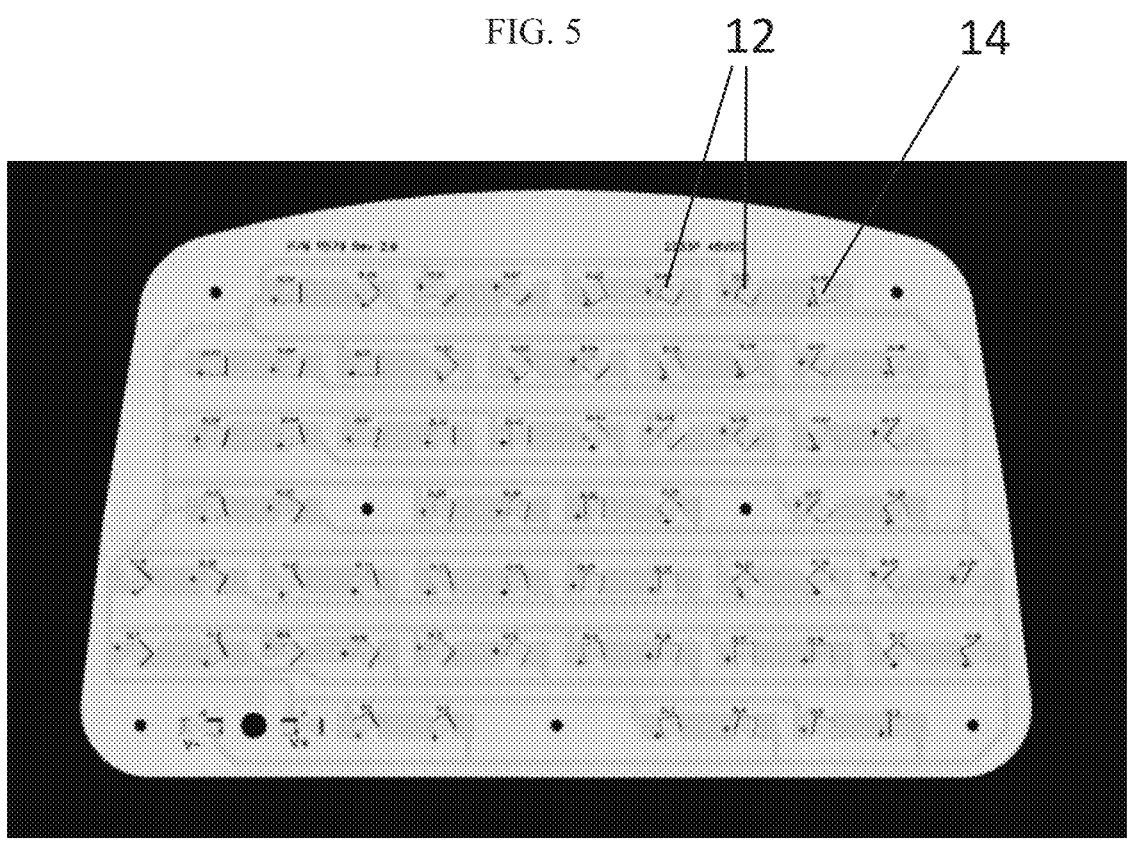
FIG. 5 illustrates a dithered LED printed circuit assembly (PCA).
Table 1 provides an example LED dithering matrix.
Figure 6:
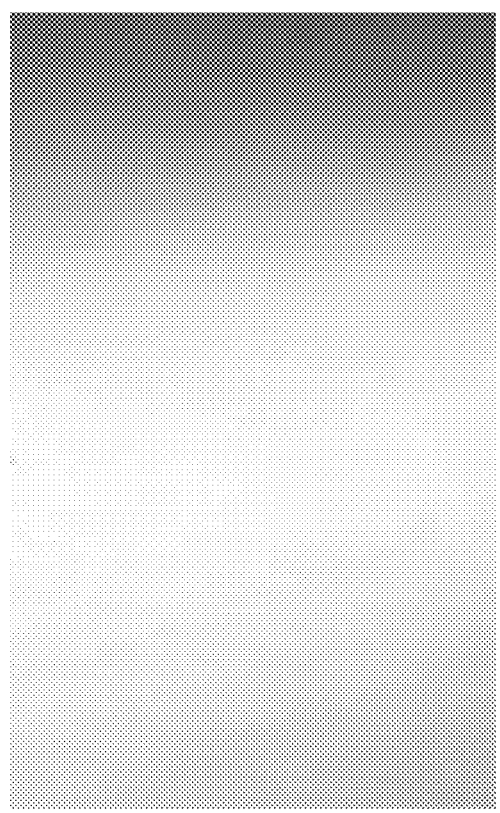
FIG. 6 illustrates an example of color banding from a spatially dithered multi-die LED package.
Figure 7:
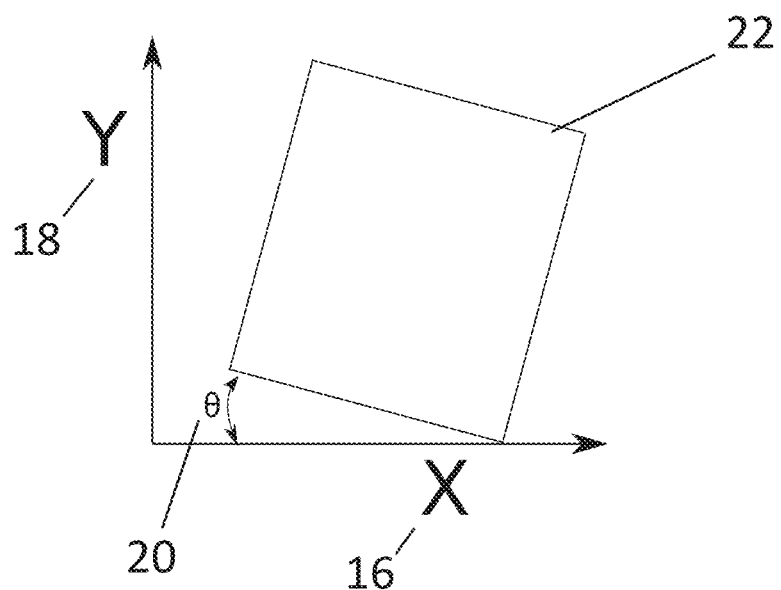
FIG. 7 illustrates a example of rotational dithering of an LED by the angle represented by the angle Θ.

An example embodiment of an LED PCA including spatially and rotationally dithered LEDs 12 positioned on a printed circuit board 14 is shown in FIG. 5. The individual LEDs have been spatially and rotationally rotated so as to minimize color banding. Each LED is displaced from the center of each lens in the X and/or Y directions by a distance that is roughly half the distance between individual LED die on each LED package. This results in the the color temperature bands from each individual LED to miss-align with those of other LEDs, which causes the bands to average out and be less apparent as shown in FIG. 6. Additionally, the LEDs are rotated at various angles to blend the bluish die and yellowish spaces rotationally to further overlap and blend the color temperature bands. The result of dithering the LEDs spatially and rotationally is a greatly reduced appearance of color temperature banding without a significant impact on the angular distribution of light from the lens design. FIG. 7 illustrates the rotational degree Θ 20 of an LED die 22 relative to the Y axis 18 and X axis 16 to measure a rotational angle when the die is rotationally dithered. The spatially dithered multi-die LED PCAs of the instant application are utilized in applications for light dispersion, such as in parking lots, street lamps, and other applications in which broad light dispersion is desired.

The depicted LED PCA of FIG. 5 was designed using a method to minimize color banding. For example, this method can include the step of determining the color temperature bands of each individual LED die, spatially and rotationally dithering each LED die relative to neighboring LED dies to minimize the color banding of the overall light. Table 1 provides an exemplary LED dithering matrix consistent with this methodology.

FIG. 6 illustrates the color banding effect from an LED PCA a plurality of spatially and rotationally dithered LED dies. As shown the yellow banding present in FIG. 4 is not as pronounced in FIG. 6.

Figure 8:
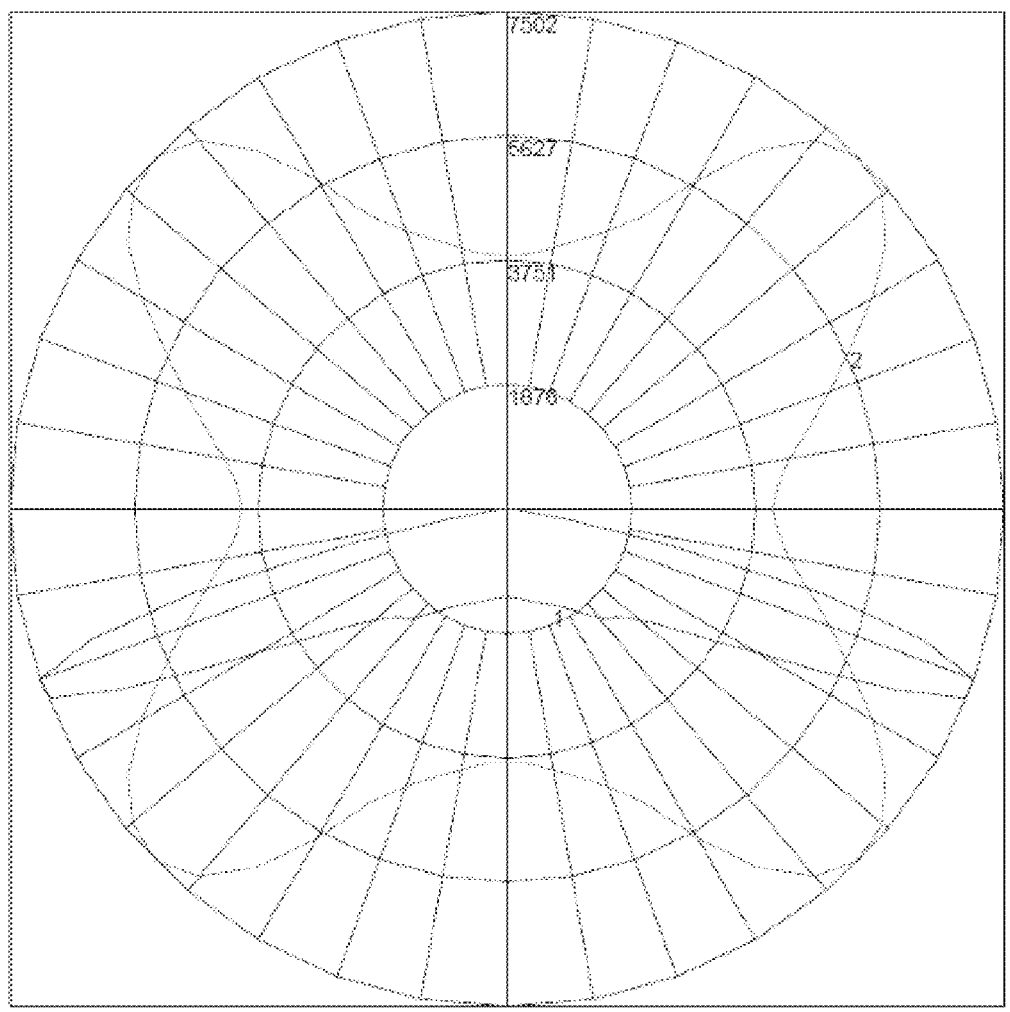
FIG. 8 illustrates light distribution through a lens of a non-spatially dithered multi die LED PCA.
Figure 9:
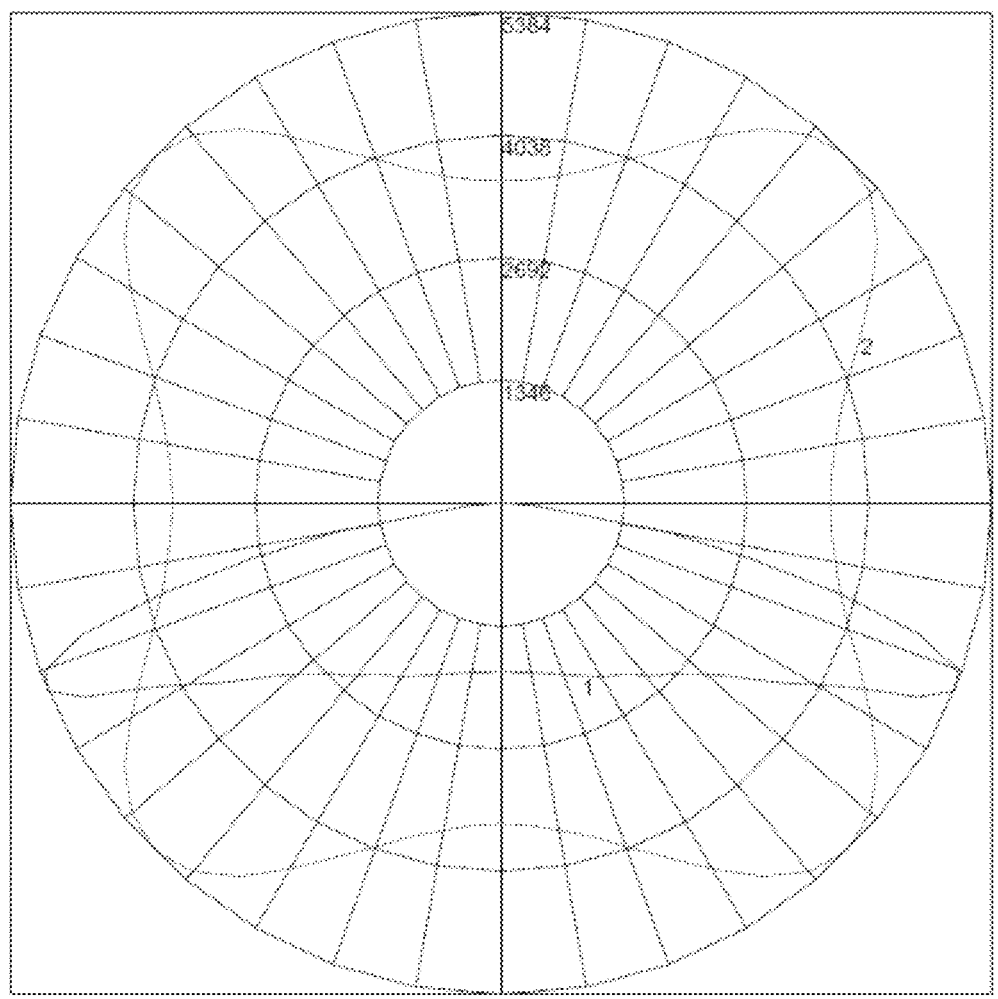
FIG. 9 illustrates light distribution through a lens of a spatially dithered multi die LED PCA.

FIGS. 8 and 9 provide a comparison of the intended light distribution of a lens of a multi-die LED PCA to the light distribution pattern of a spatially dithered multi-die LED PCA. FIG. 8 provides the intended light output of the lens. The addition of a texture to the lens would most likely alter this distribution pattern. However, as shown in FIG. 9, spatially dithering the individual LED dies serves to maintain the intended distribution of the lens, while serving to minimize color banding of the LED light fixture.

While certain exemplary embodiments are shown in the figures and described in this disclosure, it is to be distinctly understood that the presently disclosed inventive concept(s) is not limited thereto but may be variously embodied to practice within the scope of the following claims. From the foregoing description, it will be apparent that various changes may be made without departing from the spirit and scope of the disclosure as defined by the following claims.

What is claimed is:

1. A lighting apparatus comprising:
   a printed circuit board,
   a plurality of LED dies affixed to said printed circuit board, wherein said LED are spatially and rotationally dithered relative to neighboring dies so as to be configured to minimize color banding in all directions in light projected from said lighting apparatus;
   a lens configured to disperse light emitted from said LEDs of said LED dies in a broad distribution pattern to provide illumination to a wide area.

2. The lighting apparatus of claim 1, wherein said lens comprises a plurality of individual lenses each configured to distribute light of an individual LED.

3. The lighting apparatus of claim 2, wherein each of said LED dies is spatially dithered from the center of each lens in the X and/or Y directions by a distance that is approximately half the distance between individual LED die on each LED package.

4. The lighting apparatus of claim 1, wherein said lighting apparatus is configured for use as a street lamp.

5. The lighting apparatus of claim 1, wherein said lighting apparatus is configured for use as a parking lot lamp.

6. The lighting apparatus of claim 1, wherein said LED dies are rotated in 15 degree increments.

7. The lighting apparatus of claim 2, wherein said individual lenses are positioned within a lens base.

8. A method of assembling an LED light comprising multiple LED dies and configured to distribute light over a broad area, said method comprising the following steps:
   the step of providing a printed circuit board, wherein said printed circuit board is configured for the affixation of a plurality of LED dies, each at a different location on said printed circuit board;
   the step of providing a lens configured for distribution of light from each of said plurality of LED dies;
   the step of rotationally dithering said LED dies by rotating said LED dies at various angles to blend the bluish die and yellowish spaces in light emitted by said LED dies through said lens to overlap and blend the color temperature bands;
   the step of affixing said LED dies to said printed circuit board following said step of rotational dithereing said LED.

9. The method of claim 8, wherein the steps including reducing color banding comprises blending bluish die and yellowish spaces of light emitted to reduce color banding.

10. The method of claim 8, wherein said method further comprises the step of determining an angle to rotationally dither each individual led die relative to other LED dies on said board by said neighboring LED dies reduce color banding.

11. The method of claim 10, wherein said step of determining an angle to rotationally dither each LED die comprises determining an angle to rotate each individual LED die to overlap and blend color temperature bands of light emitted by said LED dies.

12. The method of claim 8, wherein said method comprises the step of determining a distance to spatially dither said LED dies to reduce color banding of light emitted from said LED dies through said lens.

13. The method of claim 12, wherein said step of determining a distance to spatially dither said LED dies comprises determining a distance to spatially dither each individual LED die to overlap and blend color temperature bands of light emitted by said LED dies.

* * * * *